(12) United States Patent
Hirler

(10) Patent No.: US 7,723,782 B2
(45) Date of Patent: May 25, 2010

(54) TRENCH STRUCTURE SEMICONDUCTOR DEVICE AND METHOD FOR PRODUCING IT

(75) Inventor: Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 547 days.

(21) Appl. No.: 11/469,070

(22) Filed: Aug. 31, 2006

(65) Prior Publication Data

US 2007/0126056 A1 Jun. 7, 2007

(30) Foreign Application Priority Data

Aug. 31, 2005 (DE) .................. 10 2005 041 285

(51) Int. Cl.
*H01L 29/94* (2006.01)

(52) U.S. Cl. ............... 257/330; 257/331; 257/E29.066

(58) Field of Classification Search ......... 257/330–332, 257/E29.066, E29.183, E29.198, E29.327; 438/259, 270, 271, 589

See application file for complete search history.

(56) References Cited

U.S. PATENT DOCUMENTS

| | | | | |
|---|---|---|---|---|
| 5,521,111 A | * | 5/1996 | Sato | 438/244 |
| 7,173,306 B2 | * | 2/2007 | Hirler et al. | 257/329 |
| 7,345,342 B2 | * | 3/2008 | Challa et al. | 257/341 |
| 2005/0082591 A1 | * | 4/2005 | Hirler et al. | 257/302 |
| 2005/0280087 A1 | * | 12/2005 | Babcock et al. | 257/343 |

* cited by examiner

*Primary Examiner*—Thinh T Nguyen
(74) *Attorney, Agent, or Firm*—Dicke, Billig & Czaja, PLLC

(57) ABSTRACT

A trench structure semiconductor device is disclosed. In one embodiment, field electrode devices are arranged in a trench structure, in direct spatial proximity in comparison with essentially planar or smooth conditions, have an enlarged common interface region with an insulation material in between, whereby a comparatively stronger electrical coupling of the directly adjacent field electrode devices is achieved.

20 Claims, 13 Drawing Sheets

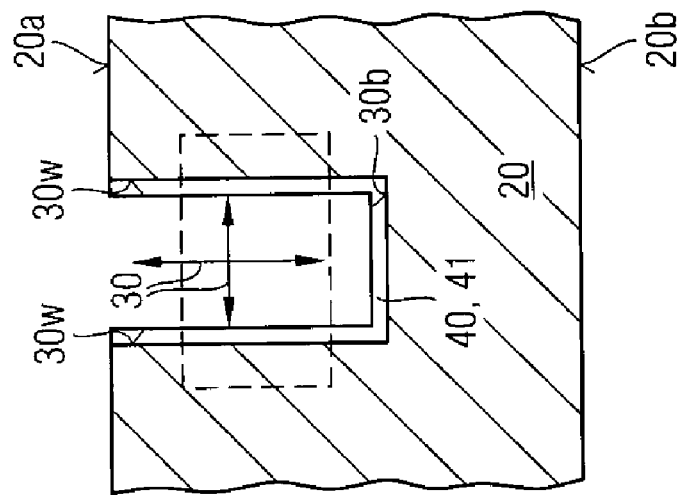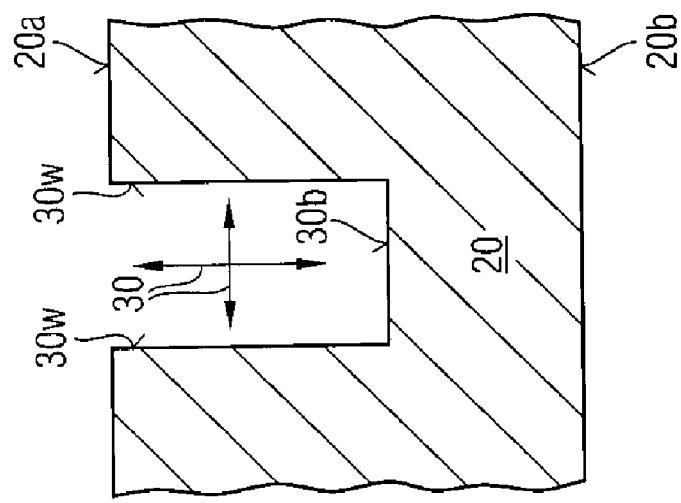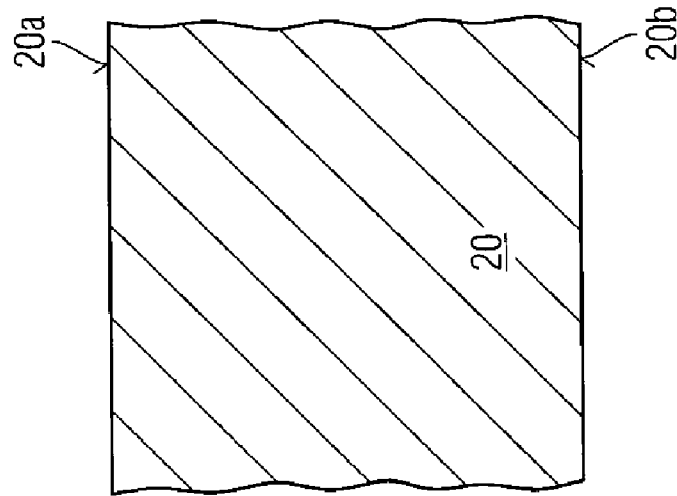

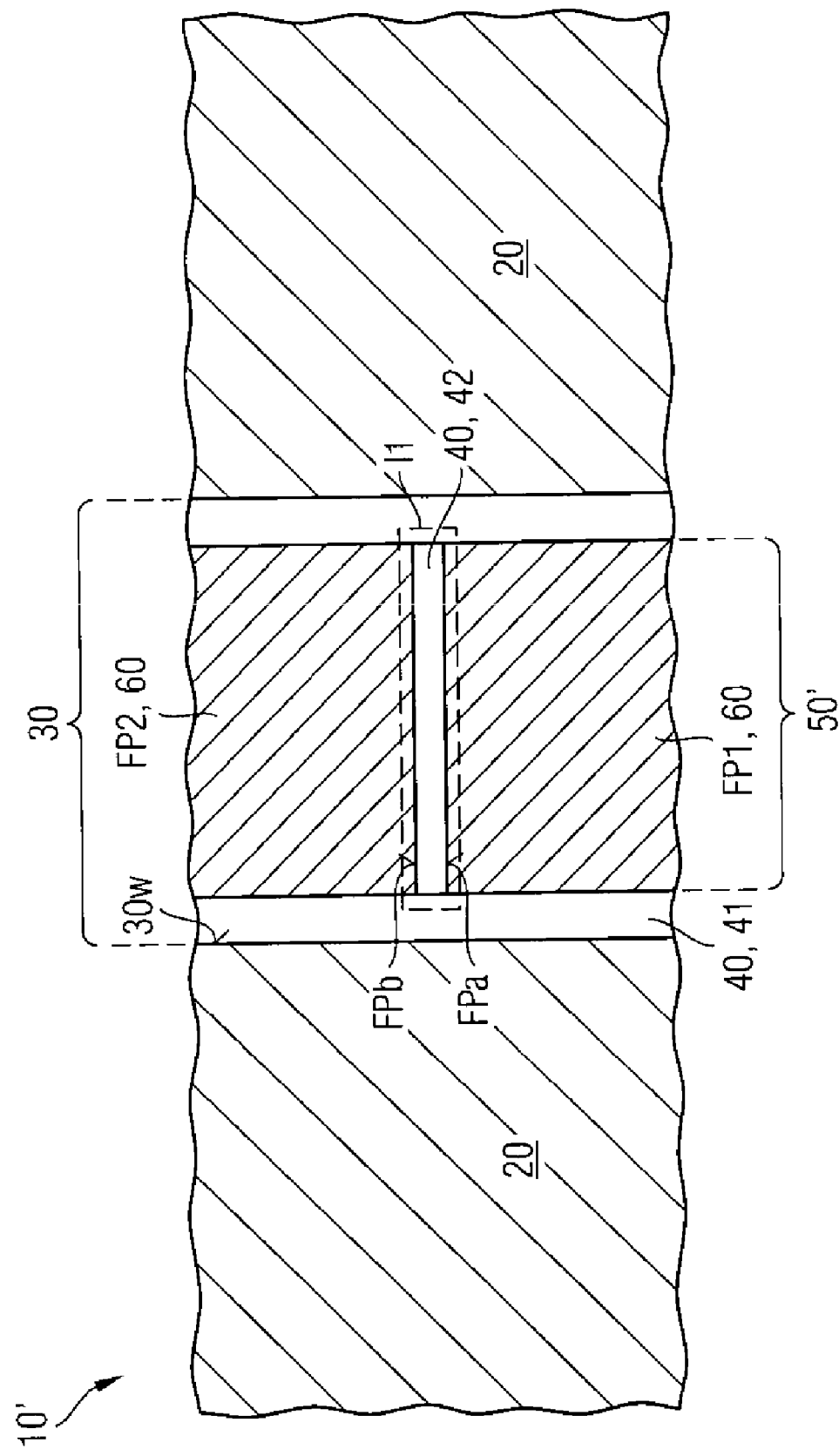

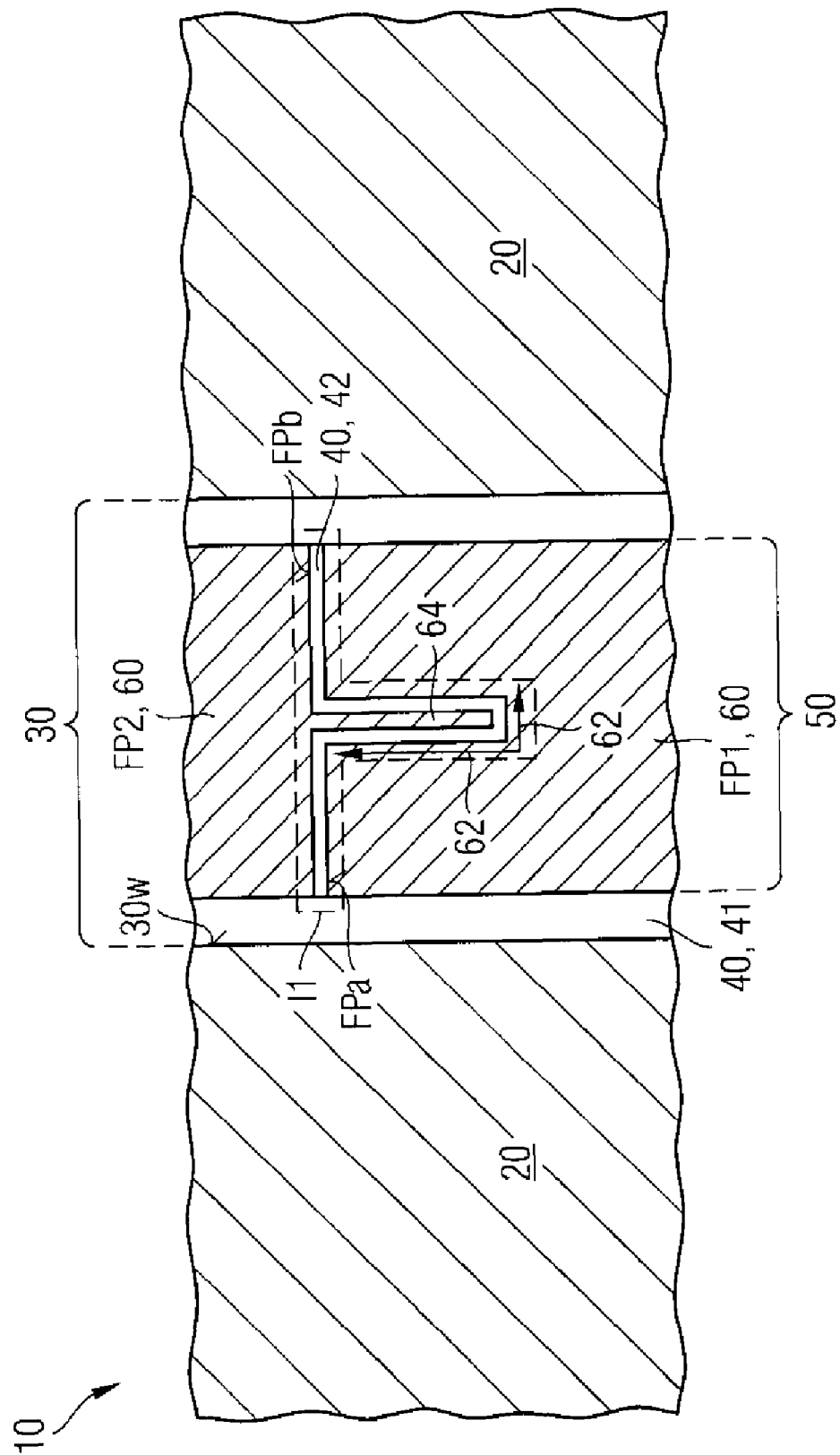

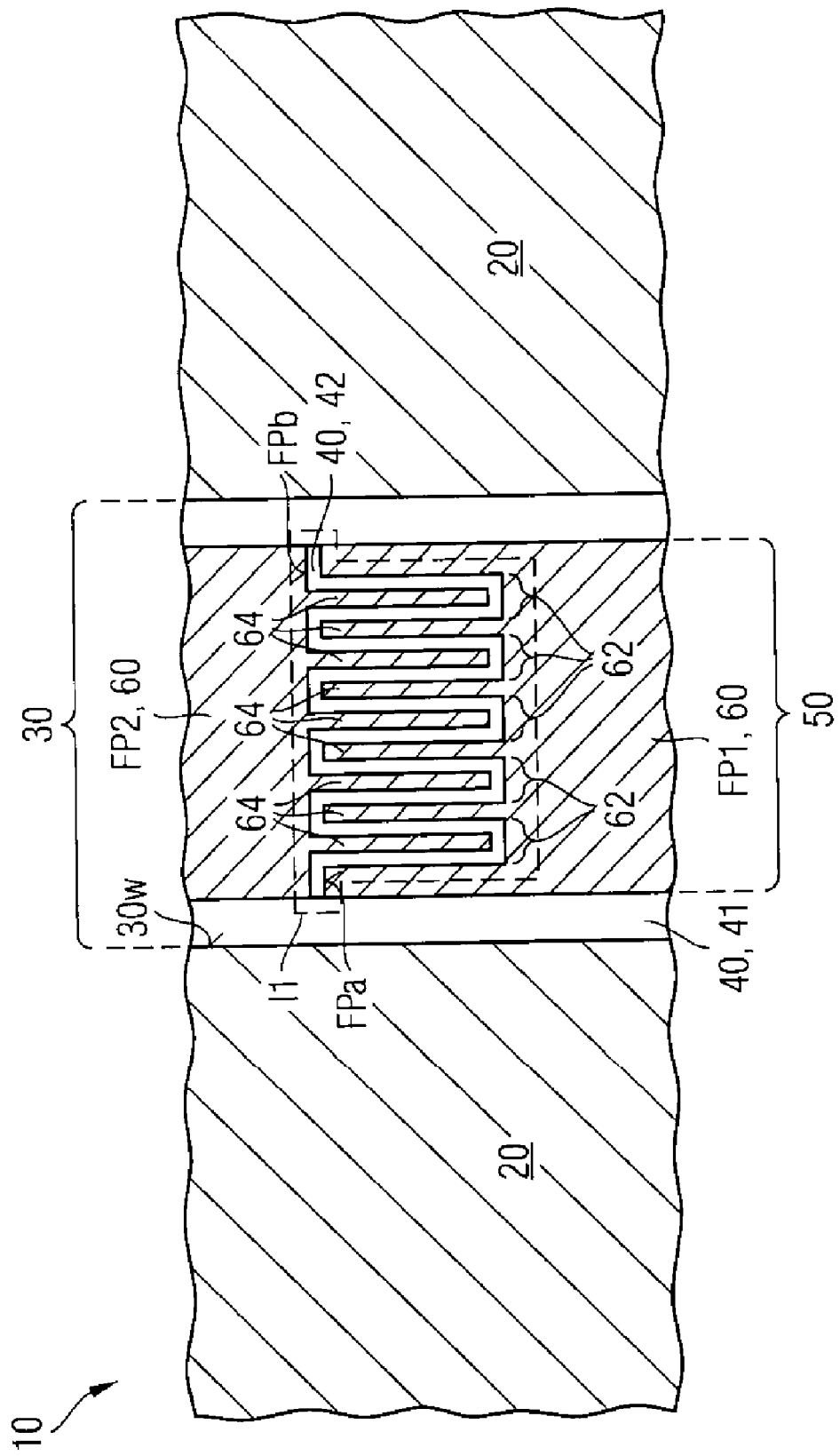

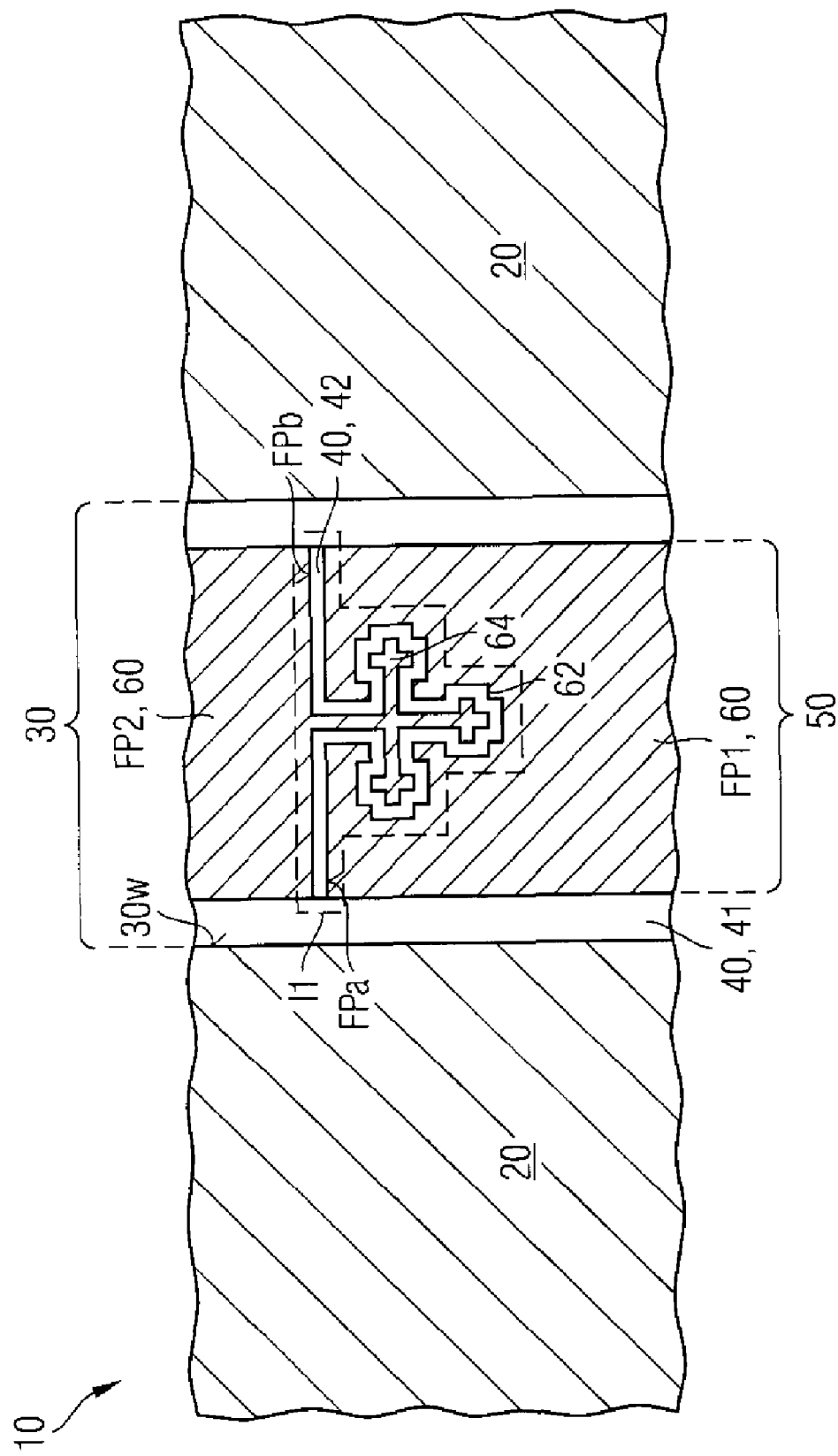

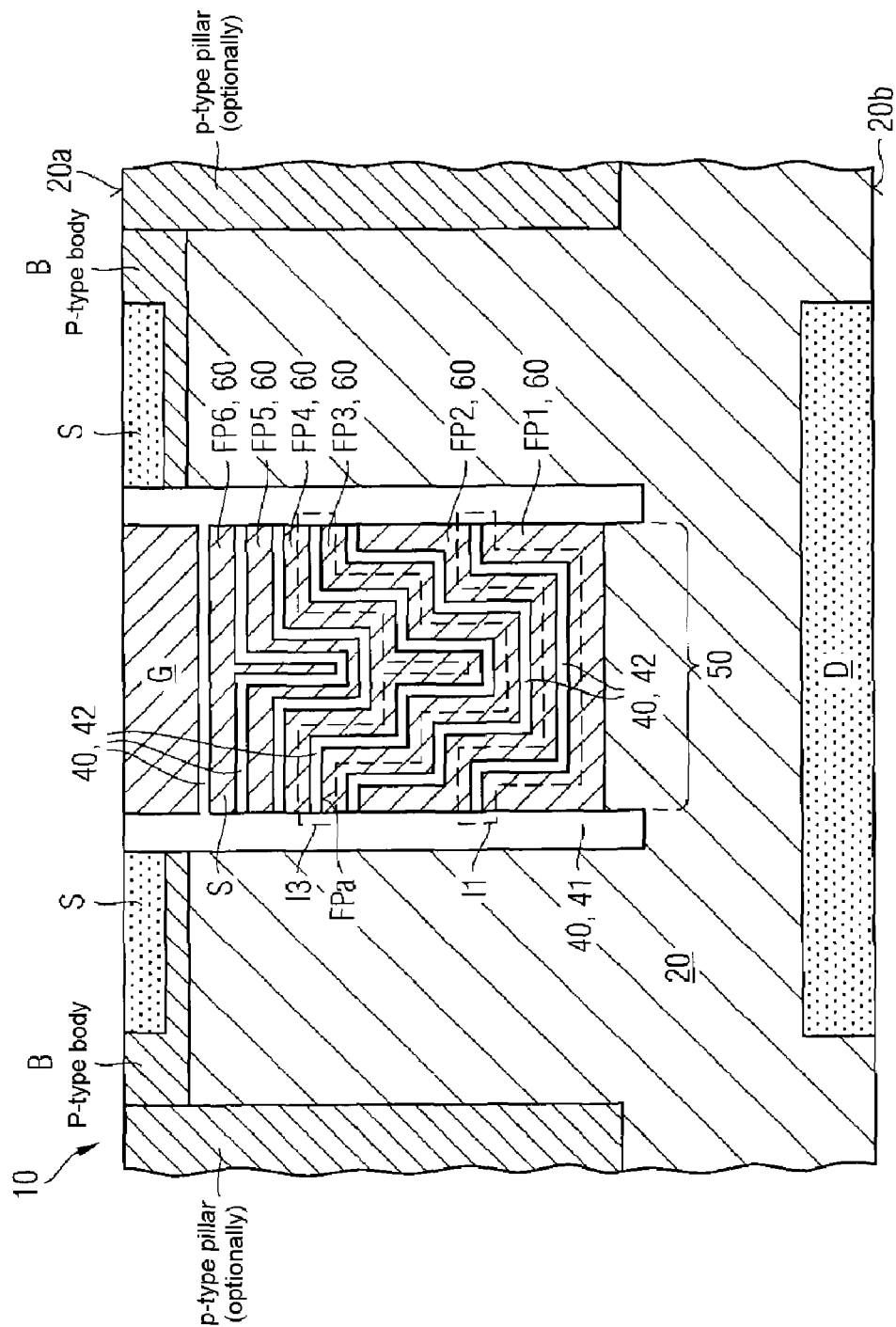

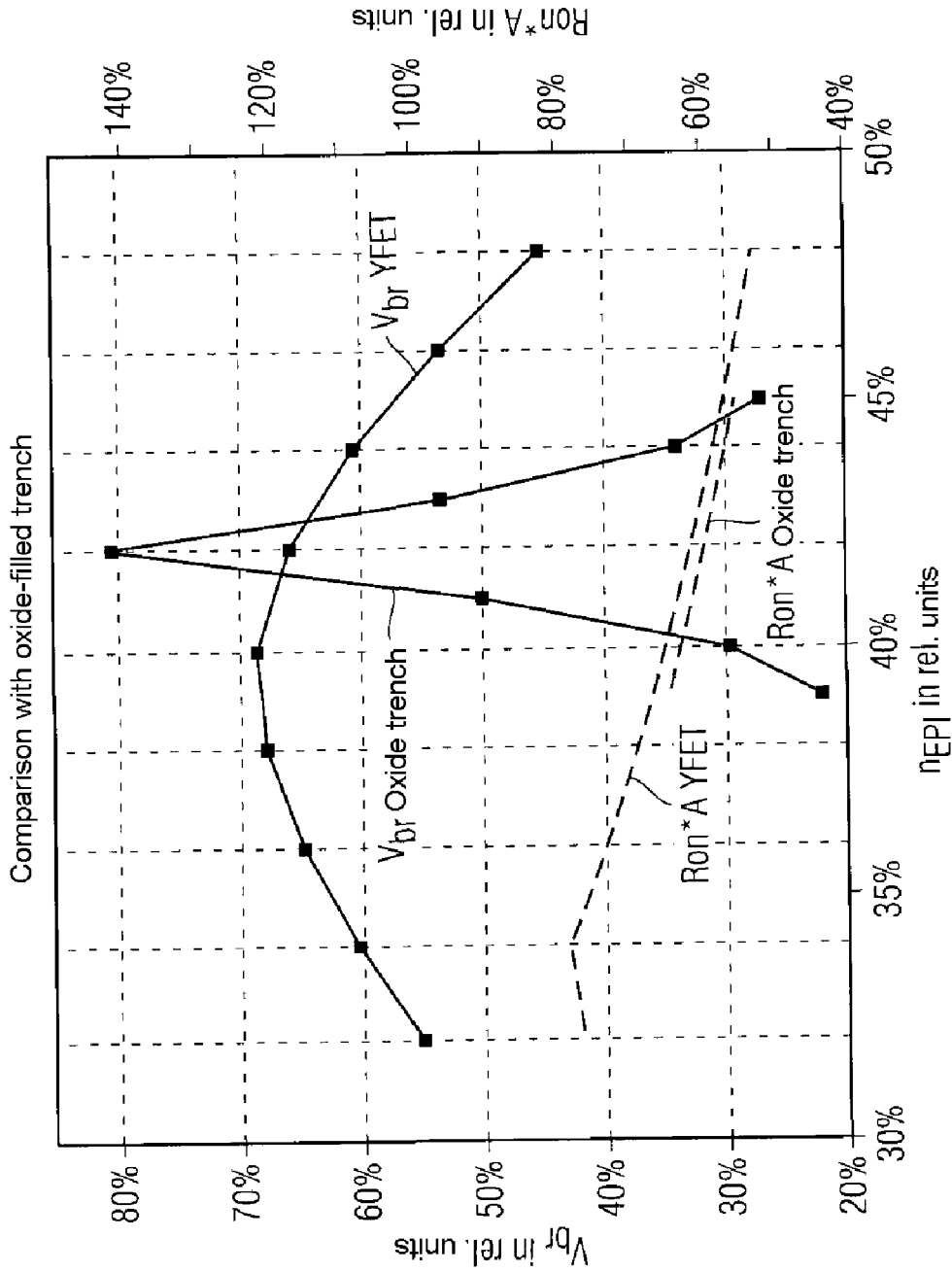

FIG 4C
FIG 4D
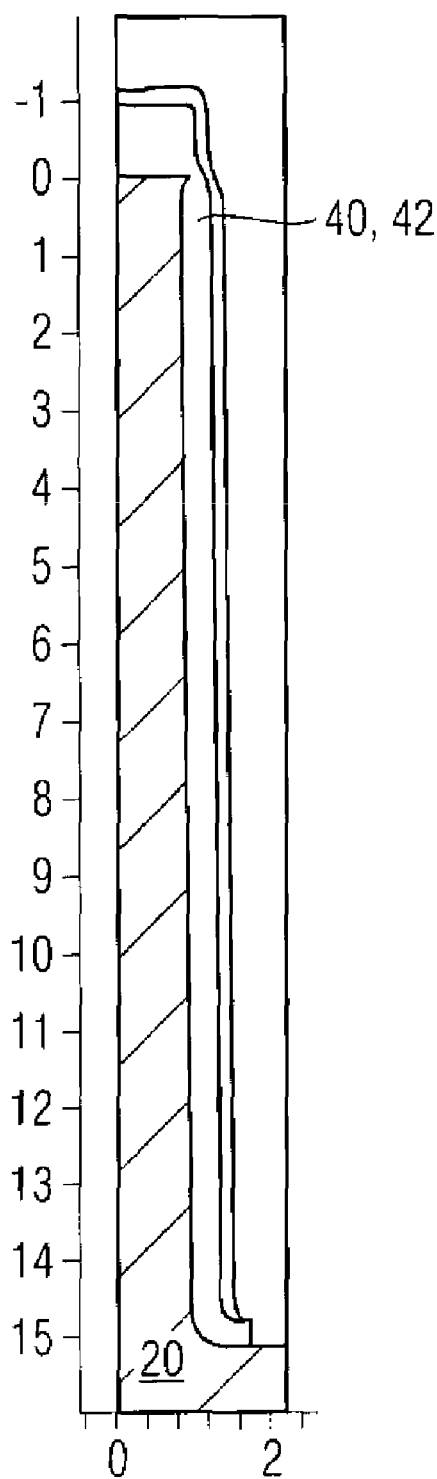
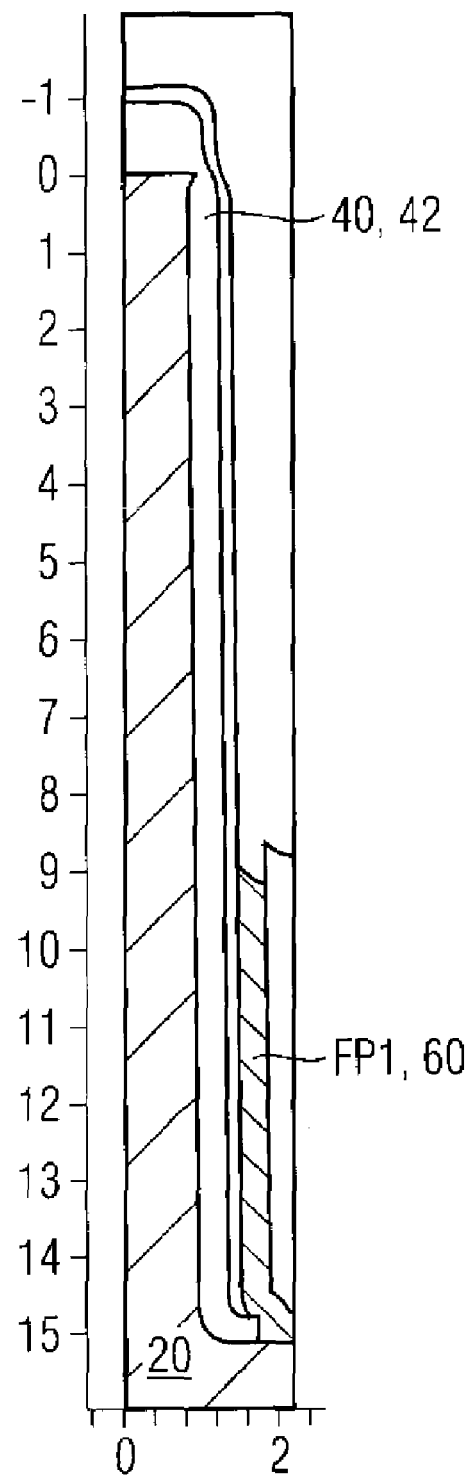

FIG 4E
FIG 4F
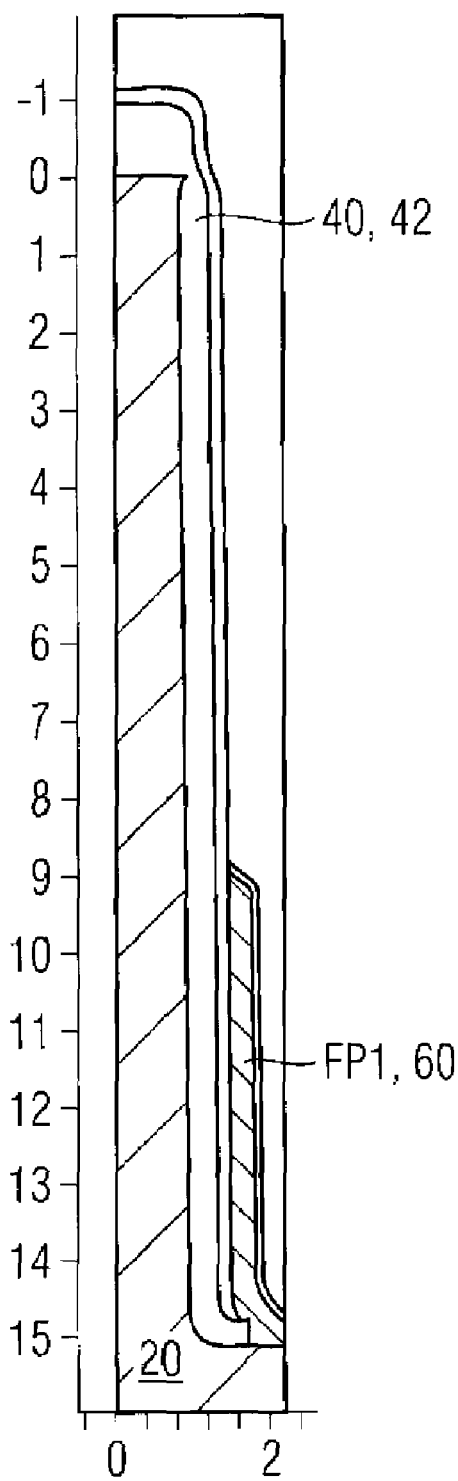
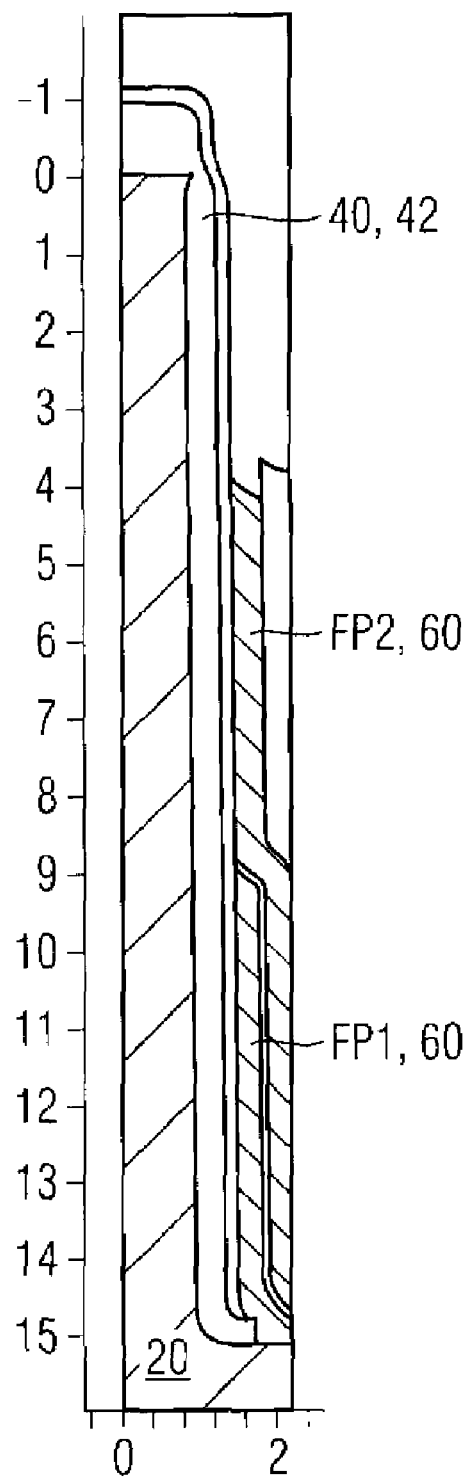

FIG 4G
FIG 4H
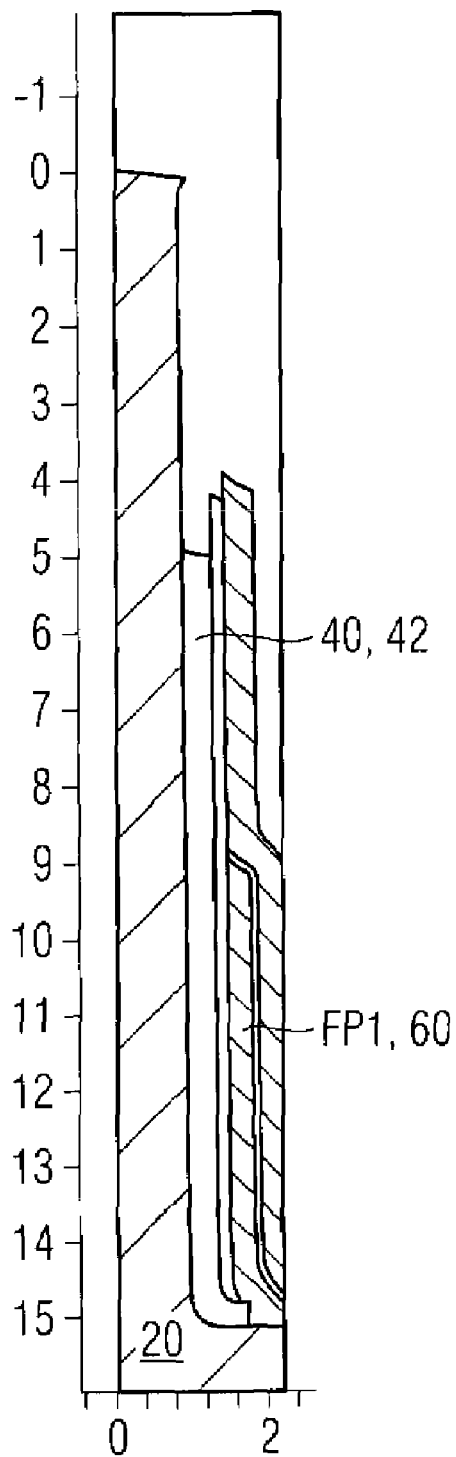
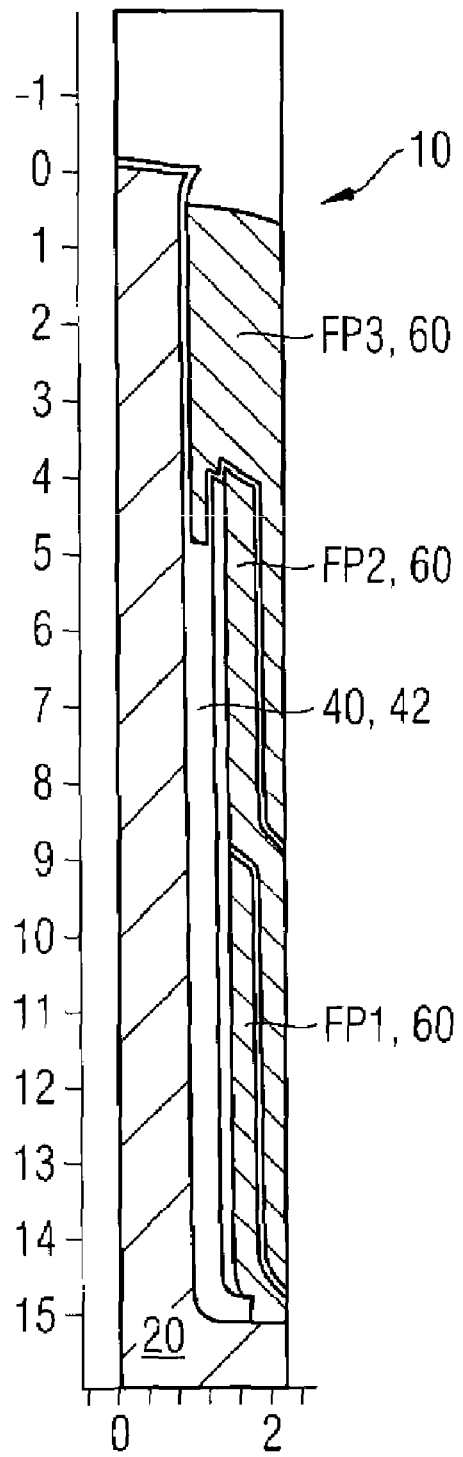

TRENCH STRUCTURE SEMICONDUCTOR DEVICE AND METHOD FOR PRODUCING IT

CROSS-REFERENCE TO RELATED APPLICATIONS

This Utility Patent Application claims priority to German Patent Application No. DE 10 2005 041 285.8 filed on Aug. 31, 2005, which is incorporated herein by reference.

BACKGROUND

The present invention relates to a trench structure semiconductor device and a method for producing it. The present invention relates, in particular, inter alia, also to a YFET field plate trench transistor with potential-free or floating field plates or field electrode devices and improved electrical coupling between the field plates or field electrode devices.

In the further development of modern semiconductor technologies, trench structure semiconductor devices or components with a trench structure are also increasingly being used. The trench structures or trenches provided in a semiconductor material region in this case may contain main electrode devices or control electrode devices. Furthermore or as an alternative thereto, it is also conceivable for field plates or field electrode devices also to be provided in the respective trench structures or trenches. The field plates or field electrode devices, even if they are formed such that they are spatially at a distance and electrically insulated from the wall regions or bottom regions of the trench structure by corresponding insulation regions, can electrically influence the surroundings there in the adjoining semiconductor material region adjacent to the trench structure and can improve the charge depletion in the off-state case. In this way, by providing corresponding field plates or field electrode devices, a specific characteristic can be impressed or modulated on corresponding semiconductor devices or components and, for a predetermined breakdown strength, the doping of the drift path can be increased and the on resistance can thereby be significantly reduced.

What is of crucial importance in the mode of operation of the field plates or field electrode devices is the coupling to the surrounding semiconductor material region, but also the coupling to the further electrode devices, e.g., control electrodes or main electrodes, but indeed also often the electrical coupling of a given field plate or field electrode device to the further field plates or field electrode devices. In this case, coupling means that e.g., as a result of the capacitance between field plate and semiconductor, the voltages of the field plate change with the voltage of the semiconductor material region, and vice versa.

For these and other reasons, there is a need for the present invention.

SUMMARY

A trench structure semiconductor device is provided, in which field electrode devices arranged in a trench structure, in direct spatial proximity in comparison with essentially planar or smooth conditions, have an enlarged common interface region with an insulation material in between, whereby a comparatively stronger electrical coupling of the directly adjacent field electrode devices is achieved.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A to 1C illustrate preparatory intermediate stages of an embodiment of the production method according to the invention for a trench structure semiconductor device in schematic and sectional side view.

FIG. 1D illustrates a conventional trench structure semiconductor device likewise in sectional and schematic side view.

FIGS. 1E to 1H illustrate embodiments of the trench structure semiconductor device according to the invention in schematic and sectional side view.

FIG. 3 illustrates a graph for elucidating a comparison of the process windows in a conventionally produced compensation structure and a structure produced according to the invention. The illustration illustrates, inter alia, the breakdown voltage as a function of the epitaxial doping in the case of partial compensation by p-type zones.

FIGS. 4A to 4H illustrate, in schematic and sectional side view, various stages that are reached in the production of a trench structure semiconductor device according to the invention in accordance with one embodiment of the production method according to the invention.

DETAILED DESCRIPTION

Figure 2A:
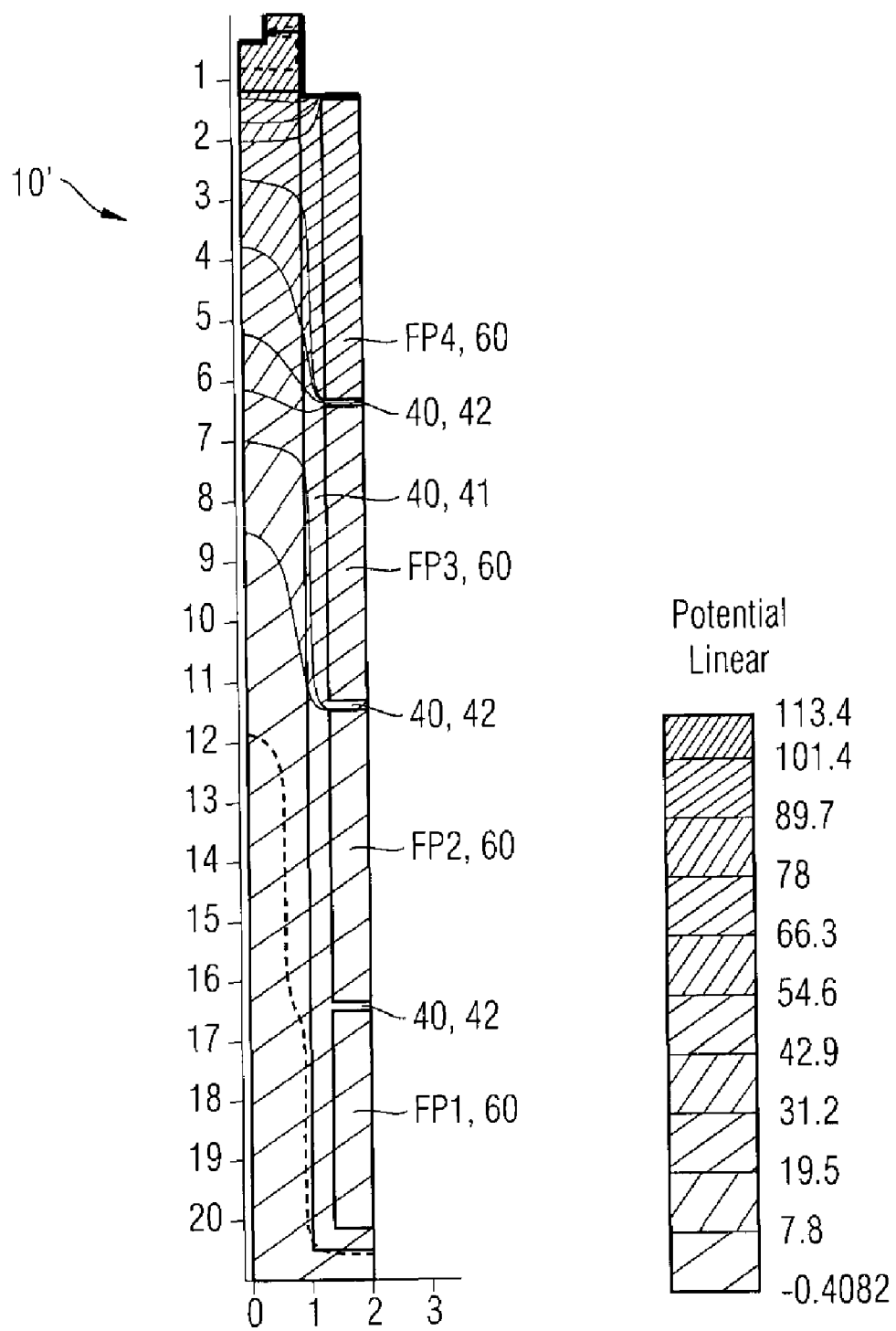
FIGS. 2A and 2B illustrate the profiles of the electrical potential in a conventional trench structure semiconductor device and an embodiment of the trench structure semiconductor device according to the invention in schematic and sectional side view.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a trench structure semiconductor device in which field electrodes provided in a trench structure have an electrical coupling to one another which can be set particularly well and exceeds the customary degree of coupling.

In one embodiment, a trench structure semiconductor device according to the invention is proposed, in which a semiconductor material region with a surface region is formed, in which at least one trench structure with a wall region and a bottom region is formed in the semiconductor material region. In the interior of the trench structure, a plurality of field electrode devices are formed as an electrode arrangement in a manner spaced apart and electrically insulated from one another and from the wall region of the trench structure by means of an insulation region. Spatially directly adjacent and mutually adjoining field electrode devices with an enlarged common interface region with an insulation material in between are formed. A stronger electrical coupling of directly adjacent and mutually adjoining field electrode devices is thereby formed in comparison with essentially planar and/or smooth conditions.

Consequently, one essential aspect of the present invention involves forming spatially directly adjacent and mutually adjoining field electrode devices or field plates in a trench structure provided in a semiconductor material region with an enlarged common interface region compared with essentially planar or smooth conditions with an insulation material in between, and thereby achieving a comparatively stronger electrical coupling of directly adjacent field plates or field electrodes, that is to say increasing the capacitance of the capacitor formed from the adjacent field plates and the insulation material lying in between.

It may also be essential that the topmost field plate is capacitively coupled well to gate and/or source and/or that the bottommost field plate is capacitively connected well to drain or directly to the potentials thereof.

In one embodiment of the trench structure semiconductor device according to the invention, the enlarged common interface region is formed by means of an increased roughness of at least one of the mutually opposite interfaces in the material of spatially directly adjacent and mutually adjoining field electrode devices in the interface region.

In another embodiment of the trench structure semiconductor device according to the invention, the enlarged common interface region is formed by means of one or a plurality of cutouts of at least one of the mutually opposite interfaces in the material of spatially directly adjacent and mutually adjoining field plate electrode devices in the interface region.

In a further embodiment of the trench structure semiconductor device according to the invention, the enlarged common interface region is formed by means of one or a plurality of elevations of at least one of the mutually opposite interfaces in the material of spatially directly adjacent and mutually adjoining field plate electrode devices in the interface region. In the sense of the invention, the elevation may also be understood as a protrusion, projection, shoulder or protuberance.

The second field plate follows the contour of the first field plate, so that the insulation or the dielectric has a homogeneous thickness.

In one embodiment of the trench structure semiconductor device according to the invention, it is provided that the cutouts and/or elevations of one of the mutually opposite interfaces in the material of a first field electrode device in the common interface region with a second, directly adjacent field electrode device adjoining the first are formed such that they cooperate or are in engagement in each case with corresponding elevations and/or cutouts of the directly adjacent and adjoining interface of the directly adjacent, adjoining and opposite interface in the material of the second field electrode device directly adjacent to and adjoining the first field electrode device in the common interface region.

In accordance with another embodiment of the trench structure semiconductor device according to the invention, it is provided that—viewed in cross section—the mutually opposite interfaces of spatially directly adjacent and mutually adjoining field electrode devices are formed such that they cooperate or are intermeshed in comb-like fashion or in comb-shaped fashion.

In one embodiment of the trench structure semiconductor device according to the invention, it is provided that—viewed in cross section—the mutually opposite interfaces of spatially directly adjacent and mutually adjoining field electrode devices are formed such that they cooperate or are intermeshed in y-like fashion or in y-shaped fashion or in the manner of a tuning fork.

In accordance with another embodiment of the trench structure semiconductor device according to the invention, it is provided that the trench structures are formed in a manner proceeding from the surface region of the semiconductor material region essentially in a first extension direction Z, which runs perpendicular to the surface region of the semiconductor material region, into the semiconductor material region.

It is particularly if, in accordance with another refinement of the trench structure semiconductor device according to the invention, the field electrode devices of the electrode arrangement are formed as a stringing together of field electrode devices in the first extension direction Z in the interior of the trench structure.

A stringing together along a surface direction is also conceivable and possible and source and drain can then be arranged on the same surface.

It is also conceivable if, in accordance with a further refinement of the trench structure semiconductor device according to the invention, the field electrode device is in each case formed in potential-free fashion or in floating fashion.

In another embodiment of the trench structure semiconductor device according to the invention it is provided that a further electrode device, and in particular a control electrode device or a gate electrode device, is formed in the interior of the trench structure in a manner facing the surface region of the semiconductor material region and in a manner spatially separated and electrically insulated from the electrode arrangement of the plurality of field electrode devices by the insulation region and from the wall region of the trench structure, from the bottom region of the trench structure and/or from the semiconductor material region.

In this case, the capacitance between gate electrode and adjoining field plate should then be increased in the same way as between two mutually adjoining field plates.

The further electrode device may be at a fixed electrical potential, in particular at source potential.

It is also conceivable for the trench structure semiconductor device to be formed as a device or as a combination of devices from the group consisting of a FET, a MOSFET, a vertical MOSFET, integrated in an IC with drain on the front side, a trench transistor, a field plate transistor, a vertical transistor, a vertical trench transistor, an IGBT device, a p-channel transistor, a bipolar transistor, a diode device and a Schottky diode device. Also conceivable are devices with a source region beneath a gate region, devices with depletable p-type pillars, devices with non-depletable, mutually separate p-type zones lying one above another.

It may be provided that a pillar region doped oppositely to the doping of the surroundings is formed in the semiconductor material region and outside the trench structure and spatially at a distance from the latter, proceeding from the surface region of the semiconductor material region, the pillar region extending into the interior of the semiconductor material region.

It is furthermore possible for pairs of spatially directly adjacent field electrode devices which, in a common interface region, adjoin one another and are opposite one another to be formed, relative to one another, in a targeted manner with differing degrees of pairwise electrical coupling or capacitance between the field electrode devices of the pairs of spatially directly adjacent field electrode devices which, in a common interface region, adjoin one another and are opposite one another, with respect to one another, in particular by means of a correspondingly targeted variation of the thickness of the insulation provided between the field electrode devices.

It may also be provided that the field electrode devices are formed such that they are electrically connected to one another via zener diodes or in high-impedance fashion in the trench structure or in an edge region.

Another embodiment of the present invention consists in providing a corresponding production method. The invention proposes a method for producing a trench structure semiconductor device, in which a semiconductor material region with a surface region is formed, in which at least one trench structure with a wall region and a bottom region is formed in the semiconductor material region, in which in the interior of the trench structure, a plurality of field electrode devices are formed as an electrode arrangement in a manner spaced apart and electrically insulated from one another and from the wall region of the trench structure by means of an insulation region, in which spatially directly adjacent and mutually adjoining field electrode devices with an enlarged common interface region with an insulation material in between are formed, and in which a stronger electrical coupling of directly adjacent and mutually adjoining field electrode devices is thereby formed in comparison with essentially planar and/or smooth conditions.

In one embodiment of the method according to the invention for producing a trench structure semiconductor device, the enlarged common interface region is formed by means of an increased roughness of at least one of the mutually opposite interfaces in the material of spatially directly adjacent and mutually adjoining field electrode devices in the interface region.

In another embodiment of the method according to the invention for producing a trench structure semiconductor device, the enlarged common interface region is formed by means of one or a plurality of cutouts of at least one of the mutually opposite interfaces in the material of spatially directly adjacent and mutually adjoining field plate electrode devices in the interface region.

In a further embodiment of the method according to the invention for producing a trench structure semiconductor device, the enlarged common interface region is formed by means of one or a plurality of elevations of at least one of the mutually opposite interfaces in the material of spatially directly adjacent and mutually adjoining field plate electrode devices in the interface region. In the sense of the invention, the elevation may also be understood as a protrusion, projection, shoulder or protuberance.

In one embodiment of the method according to the invention for producing a trench structure semiconductor device, it is provided that the cutouts and/or elevations of one of the mutually opposite interfaces in the material of a first field electrode device in the common interface region with a second, directly adjacent field electrode device adjoining the first are formed such that they cooperate or are in engagement in each case with corresponding elevations and/or cutouts of the directly adjacent and adjoining interface of the directly adjacent, adjoining and opposite interface in the material of the second field electrode device directly adjacent to and adjoining the first field electrode device in the common interface region.

In accordance with another embodiment of the method according to the invention for producing a trench structure semiconductor device, it is provided that—viewed in cross section—the mutually opposite interfaces of spatially directly adjacent and mutually adjoining field electrode devices are formed such that they cooperate or are intermeshed in comb-like fashion or in comb-shaped fashion.

In one embodiment of the method according to the invention for producing a trench structure semiconductor device, it is provided that—viewed in cross section—the mutually opposite interfaces of spatially directly adjacent and mutually adjoining field electrode devices are formed such that they cooperate or are intermeshed in y-like fashion or in y-shaped fashion or in the form of a tuning fork.

In accordance with another embodiment of the method according to the invention for producing a trench structure semiconductor device, it is provided that the trench structures are formed in a manner proceeding from the surface region of the semiconductor material region essentially in a first extension direction Z, which runs perpendicular to the surface region of the semiconductor material region, into the semiconductor material region.

It is particularly if, in accordance with another refinement of the method according to the invention for producing a trench structure semiconductor device, the field electrode devices of the electrode arrangement are formed as a stringing together of field electrode devices in the first extension direction Z in the interior of the trench structure.

It is also conceivable that, in accordance with a further refinement of the method according to the invention for producing a trench structure semiconductor device, the field electrode device is in each case formed in potential-free fashion or in floating fashion.

In another embodiment of the method according to the invention for producing a trench structure semiconductor device, it is provided that a further electrode device, and in particular a control electrode device or a gate electrode device, is formed in the interior of the trench structure in a manner facing the surface region of the semiconductor material region and in a manner spatially separated and electrically insulated from the electrode arrangement of the plurality of field electrode devices by the insulation region and from the wall region of the trench structure and/or from the semiconductor material region.

It may be provided that the further electrode device is formed such that it is at a fixed electrical potential, in particular at source potential.

It is also conceivable for the trench structure semiconductor device to be formed as a device or as a combination of devices from the group consisting of a FET, a MOSFET, a trench transistor, a field plate transistor, a vertical transistor, a vertical trench transistor, an IGBT device, a p-channel transistor, a bipolar transistor, a diode device and a Schottky diode device.

A pillar region doped oppositely to the doping of the surroundings may be formed in the semiconductor material region and outside the trench structure and spatially at a distance from the latter, proceeding from the surface region of the semiconductor material region, the pillar region extending into the interior of the semiconductor material region, in particular in the form of a p-type pillar.

Pairs of spatially directly adjacent field electrode devices which, in a common interface region, adjoin one another and are opposite one another may be formed, relative to one another, in a targeted manner with differing degrees of pairwise electrical coupling or capacitance between the field electrode devices of the pairs of spatially directly adjacent field electrode devices which, in a common interface region, adjoin one another and are opposite one another, with respect to one another, in particular by means of a correspondingly targeted variation of the thickness of the insulation provided between the field electrode devices.

It is also conceivable for the field electrode devices to be formed such that they are electrically connected to one another via zener diodes or in high-impedance fashion in the trench structure or in an edge region.

Figure 4A:
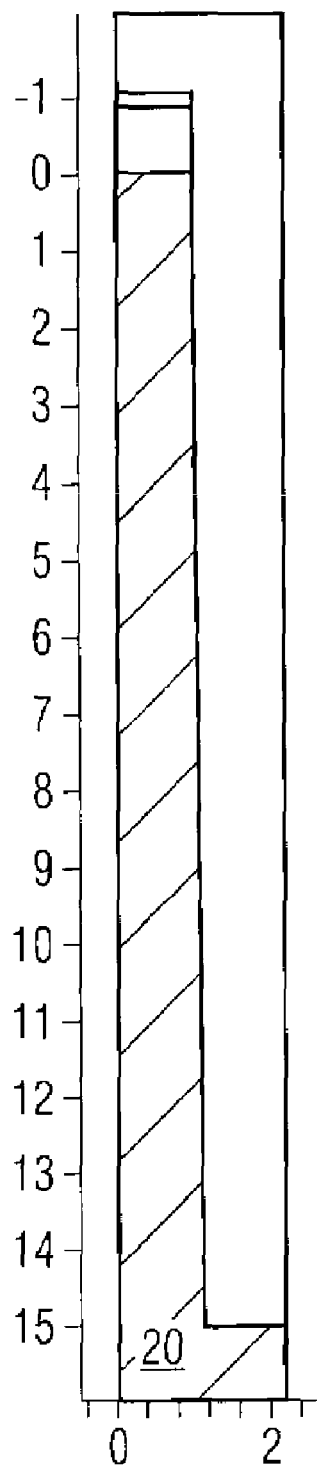

The sequence of the field electrode devices may be formed by corresponding repetition of a sequence of method processes including a process of deposition of polysilicon with a thickness which is less than half of the width of the remaining trench opening or trench width, reduced by the thickness of an oxide to be formed later and to such an extent such that the remaining trench structure is filled in the bottom region and only the trench sidewall and trench bottom or the wafer surface are lined, a step of filling the trench with an auxiliary layer which is etched selectively with respect to poly and serves as a poly etching mask, a step of etching back the auxiliary layer in the trench structure as far as a defined height or depth, a step of isotropic poly etching with the auxiliary layer as masking, with the result that the structure illustrated in FIG. 4D arises, a step of removing the auxiliary layer and a step of oxidizing the polysilicon, the last oxidation being obviated.

In this case, a photoresist, polysilicon, a multilayer system, in particular having oxide, nitride and/or polysilicon, are used as auxiliary layer or for the auxiliary layer.

A multilayer system may be formed as or for a field electrode device, in which multilayer system polysilicon layers which are doped differently, and can therefore be etched at different etching rates with the same etching medium, are used and formed.

Also conceivable is an embodiment of the method according to the invention for forming a trench structure semiconductor device in which the sequence of method processes is performed singly or multiply which comprises a step of deposition of an electrode layer, in particular of polysilicon, with a thickness which is less than half of the width of the remaining trench opening or trench width, if appropriate or in particular reduced by double the thickness of an insulator or oxide to be formed later, if these are deposited, in the case of oxidation approximately the single thickness suffices, and to such an extent such that the remaining trench structure is filled in its lower region and, in its upper region, only the trench sidewall and also the wafer surface are lined, a step of filling the trench with an auxiliary layer which is etched selectively with respect to the electrode layer and serves as an etching mask with regard to the electrode layer, a step of etching back the auxiliary layer in the trench structure as far as a defined height or depth, a step of isotropically etching the electrode layer with the auxiliary layer as masking.

In this case, it may also be provided that the sequence of processes furthermore has a step of removing the auxiliary layer and a step of introducing an insulator, the last step of introducing an insulator in particular being obviated in each case when the sequence is performed multiply.

It may also be provided that a photoresist, a polysilicon, a multilayer system, in particular having oxide, nitride and/or polysilicon, are used as auxiliary layer or for the auxiliary layer.

It may furthermore be provided that a multilayer system is formed as or for a field electrode device, in which multilayer system material layers, in particular polysilicon layers, which are formed differently, in particular are doped differently, and can therefore be etched at different etching rates with the same etching medium, are used and formed.

A further and independent embodiment of the present invention provides a method for producing a trench structure semiconductor device.

This method according to the invention for producing a trench structure semiconductor device where a semiconductor region with a surface region is formed, that at least one trench structure with a wall region and a bottom region is formed in the semiconductor material region, that a plurality of structure elements are formed in the interior of the trench structure, that the sequence of method processes is performed singly or multiply which comprises a process of deposition of a material layer for a structure element, in particular of polysilicon, with a thickness which is less than half of the width of the remaining trench opening or trench width, if appropriate or in particular reduced by double the thickness of an insulator or oxide to be formed later, if these are deposited, in the case of oxidation approximately the single thickness suffices, and to such an extent such that the remaining trench structure is filled in its lower region and, in its upper region, only the trench sidewall and also the wafer surface are lined, a step of filling the trench with an auxiliary layer which is etched selectively with respect to the material layer for a structure element and serves as an etching mask with regard to the material layer for a structure element, a step of etching back the auxiliary layer in the trench structure as far as a defined height or depth, a step of isotropically etching the material layer for a structure element with the auxiliary layer as masking.

In this case, it is conceivable that the sequence of processes furthermore has a process of removing the auxiliary layer and a step of introducing an insulator, the last process of introducing an insulator in particular being obviated in each case when the sequence is performed multiply.

Furthermore, it is also conceivable that a photoresist, a polysilicon, a multilayer system, in particular having oxide, nitride and/or polysilicon, are used as auxiliary layer or for the auxiliary layer.

The invention also relates, inter alia, in particular to field plate trench transistors of the YFET type with floating field plates and improved coupling between the field plates.

Technical Problem

One objective is to achieve an improvement of the capacitive coupling of two field plates, which can simultaneously be produced using simple means and is at the same time electrically efficient.

Conventional Procedure

In the case of the field plate trench transistors, there is the problem for high voltages—typically in the region of approximately 600 V—that very thick oxides having a thickness of several micrometers are required in the trench. These oxides cannot be produced in a practically appropriate manner nowadays and would cause high mechanical stresses. Therefore, there are investigations revolving around field plate trench transistors with a plurality of field plates in the trench which manage with smaller field oxide thicknesses. However, since the entire charge in the mesa has to be compensated for by charges on the field plates in the off-state case, very low-impedance voltage sources have to be available for each field plate and the realization of the voltage sources, both on the chip and externally, is associated with very high outlay and space requirement. If only one field electrode is present, it can be connected to the source potential. For thinner oxides it is necessary to use higher potentials that are not even present in a three-pin package.

Therefore, potential-free or floating field plates are advantageous, under certain circumstances, although they have to be capacitively coupled significantly better to overlying and underlying field plates than to the sidewall. Such structures have also already been proposed. However, since their realization requires high-k materials with a dielectric constant having a value of 20 or more, a realization is not currently foreseeable owing to the difficult integration of such materials into a trench. A use of very thin dielectrics having a low dielectric constant, such as e.g., oxides, is precluded since the voltage difference occurring between two field plates lying one above another cannot thereby be taken up and breakdowns would occur.

Aspects of the Procedure According to the Invention

A structure having, in particular, potential-free or floating field plates or field electrodes is proposed which permits a significantly improved capacitive coupling of the field plates or field electrodes to underlying and overlying field plates or field electrodes in conjunction with a thickness required for insulation. As a result, it is also possible to use dielectrics having a low dielectric constant, such as e.g., oxides.

This is achieved geometrically using of an enlargement of the surface area between the two field plates, e.g., by providing depressions in one of the field electrodes which are then lined with a dielectric. The remaining cavities are finally filled by parts of the other field plate. In this case, it is expedient if the cavities have a largest possible surface area, that is to say firstly are very deep—FIG. 1E—secondly have as many cavities as possible—FIG. 1F—and/or thirdly have structures for producing roughnesses, see FIG. 1G.

Although this structure permits the use of dielectrics having a low dielectric constant such as Si oxide, it is nevertheless advantageous to improve the capacitive coupling by means of dielectrics having a higher $\epsilon$. What are appropriate for this purpose are, for example, AlN, $Al_2O_3$, $Si_3N_4$, $Ta_2O_5$, $TiO_2$, $BaTiO_3$, $HfO_2$, $ZrO_2$, PbBaZTiO or others.

A corresponding capacitive coupling with maximum area is also produced with respect to the n-type zone in the lower region of the drift zone and also with respect to the gate electrode or source electrode.

Figure 2B:
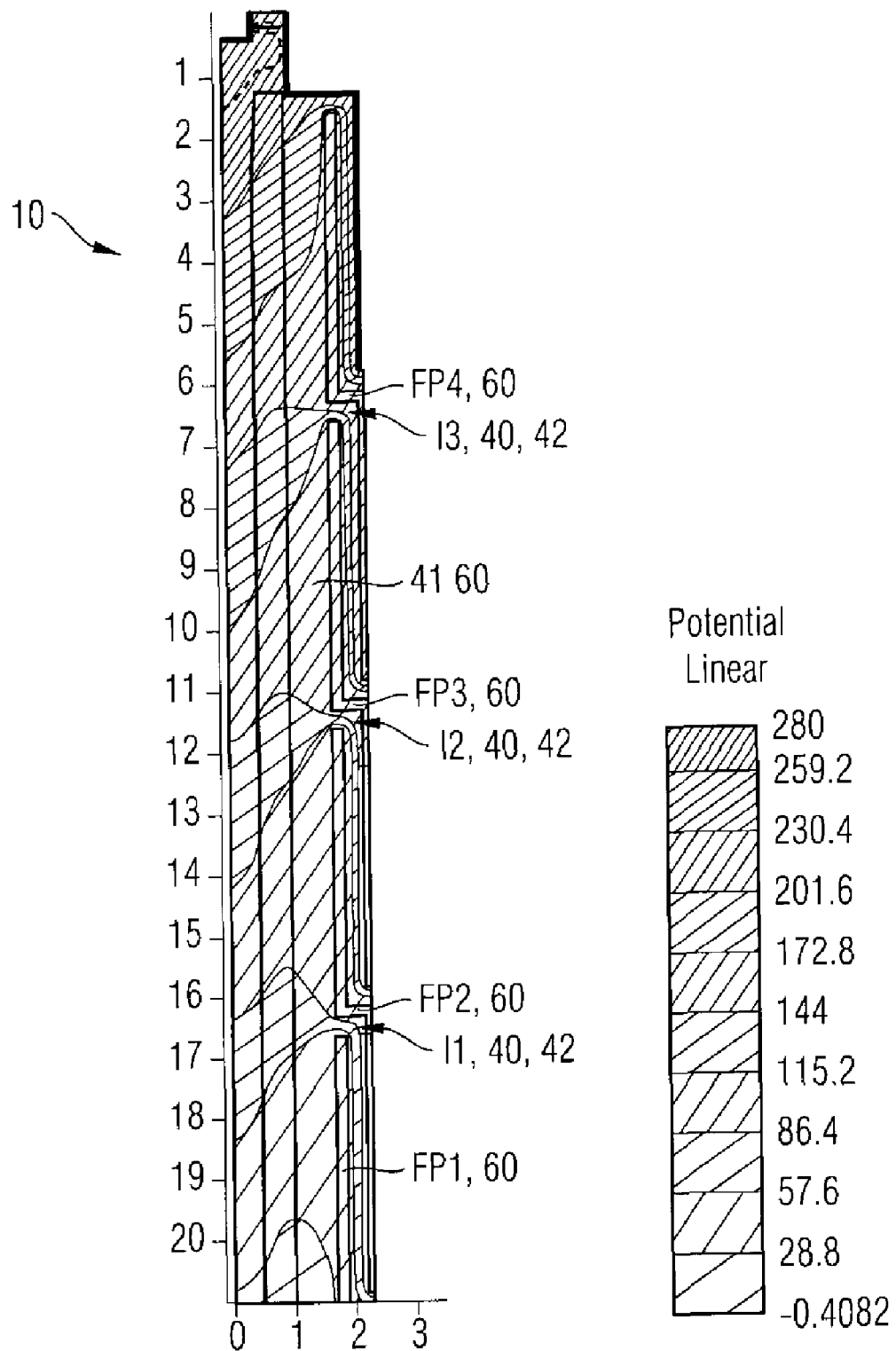

FIGS. 2A, B illustrate, inter alia, a comparison between a conventional structure in accordance with FIG. 2A and a structure according to the invention in accordance with FIG. 2B with Y-like or cross-sectionally Y-shaped field plates; only half of the structure is respectively illustrated here. Although the conventional structure in accordance with FIG. 2A has significantly thinner polyoxides, it effects blocking to a significantly lesser extent than the structure according to the invention from FIG. 2B. The structure according to the invention from FIG. 2B additionally has a p-type pillar as well.

One embodiment of the invention is the enlargement of the dielectric area or of the direct or indirect region or overlap between two directly adjacent field plates.

Further Detail Aspects (1) The combination of a compensated drift path in which p-type pillars are provided in the n-type drift path appears to be the most promising for practical use. In this case, a basic compensation is achieved by means of the p-type pillars. Deviations from the ideal compensation are compensated for by the field plates. This results in a relatively large process window for the compensation accuracy of n-type and p-type doping.

FIG. 3 illustrates a comparison between the process window of a conventional compensation structure with oxide-filled trench (red) and the structure according to the invention.

(2) A shielding electrode, which is best at source potential, may be fitted between gate electrode and floating field plate.

(3) The gate electrode need not be fitted in the trench, but rather may lie above the Si surface.

(4) Without a p-type pillar or in the case of a p-type pillar that is lightly doped in comparison with the drift zone, an increase in the thickness of the dielectrics from top to bottom and/or a decrease in the dielectric constant is expedient in order that the capacitive coupling to the respectively overlying and underlying field plates may be configured differently. The converse situation is applicable in the p-loaded case.

(5) The invention can also be applied to p-channel transistors, bipolar transistors, diodes, Schottky diodes, IGBTs, etc. These structures may be integrated in ICs and then have e.g., the drain terminal led to the front side.

(6) In order to prevent uncontrolled charging of individual field plates by leakage currents, it is expedient to connect the field plates to one another in very high-impedance fashion or e.g., by means of zener diode chains in the edge or in the trench, so that the capacitive coupling determines the potentials on the field plates in the case of momentary switching operations, but on a long time scale the voltage divider determines the potentials on the field plates. Furthermore, the field plates may be connected to floating p-type zones in the edge for this purpose.

(7) Possible Process

Deposition of trench mask with nitride, either on oxide or between oxide layers.

Etching trench hard mask and trench.

Thermal oxidation of field oxide, possibly also deposition.

Deposition of nitride.

Anisotropic nitride etching, so that nitride is removed only at the bottom.

Oxide etching (bottom).

(a) Deposition of poly with a thickness of less than half of the remaining opening (minus later oxides), so that only the trench sidewall and trench bottom and wafer surface are lined.

Filling the trench with an auxiliary layer, e.g., photoresist, which can be etched selectively with respect to poly and can serve as a poly etching mask.

Etching back the auxiliary layer into the trench as far as a defined height.

Isotropic poly etching with the auxiliary layer as masking.

Removal of the auxiliary layer.

Oxidation of the poly.

Single or multiple repetition of processes ab (a) the last oxidation being obviated.

Etching of the nitride.

Etching of the oxide.

Growth or application of the gate oxide.

Deposition and etching back of the gate poly.

Further processes for introducing the dopings, metallization, etc. may follow.

The FIGS. 4A to 4H illustrate details of a process sequence and are explained further below.

(8) Process with Poly Plug

As an alternative to the resist plug, it is also possible to use a poly plug, which can be etched back with higher accuracy. A multilayer system e.g., having oxide, nitride and poly may then be used instead of the photoresist, the trench being completely filled with the poly. After the poly has been etched back, the nitride is etched and the poly of the poly plug is completely removed. The oxide is then etched in a manner masked by the nitride, and so is the poly of the field plates. Oxide and nitride are then removed. Remainder as above.

(9) Process with Multilayer Poly

When a multilayer field plate is used, different etching rates of the individual layers can be utilized to produce a structure similar to FIG. 1F. The field plate could comprise differently doped poly layers, for example, which are etched at different rates in suitable etching or plasma etching processes.

Structurally and/or functionally similar or equivalent structures or method processes are designated by the same reference symbols below. A detailed description of the structural elements or method processes is not repeated on every occasion of their occurrence.

The sequence of FIGS. 1A-1C illustrates various intermediate stages that are reached in an embodiment of the method according to the invention for producing a trench structure semiconductor device 10.

A semiconductor material region 20 with a surface region 20a, which is formed essentially in planar fashion in this case, is provided in accordance with FIG. 1A.

In the transition to the intermediate state illustrated in FIG. 1B, a trench 30 is then driven into the interior of the semiconductor material region 20, proceeding from the surface region 20a of the semiconductor material region 20. The trench 30 or the trench structure 30 thus extends essentially perpendicular, proceeding from the surface region 20a of the semiconductor material region 20, in the direction Z into the interior of the semiconductor material region 20. This extension direction Z of the trench 30 or of the trench structure 30 into the interior of the semiconductor material region 20 is also referred to as first extension direction Z. The trench itself has wall regions 30w and also a bottom region 30b. The trench 30 or the trench structure 30 may also extend laterally in the semiconductor material region 20, to be precise into the plane of the drawing in FIG. 1B, this direction being referred to as second or lateral extension direction X of the trench structure 30 or of the trench 30.

As an alternative, the trench, as seen from above, may form round, oval or polygonal holes or form a lattice structure.

In the transition to the intermediate state illustrated in FIG. 1C, the wall region 30w and the bottom region 30b are lined with a layer of a first insulation material 41 of an insulation region 40, to be precise in such a way that the trench 30 overall is not completely filled.

The bottommost field electrode may also be conductively connected directly to the semiconductor material 20. The insulation material 41 is then formed only in the wall region 30w.

The sequence of FIGS. 1E-1H illustrates various intermediate states that can be reached proceeding from the intermediate state of FIG. 1C in various embodiments of the production method according to the invention in the case of a trench structure semiconductor device 10. The intermediate states of FIGS. 1E-1H ultimately differ essentially exclusively by virtue of the configuration of the electrode arrangement 50 and in particular by virtue of the configuration and variation of the field plates or field electrodes FP1, FP2 formed with the electrode arrangement 50. FIGS. 1E-1G practically represent an excerpt enlargement from the arrangement of FIG. 1C after filling with a corresponding electrode arrangement 50. The electrode arrangements 50 illustrated in FIGS. 1E-1H are not restricted to the number of two field plates or field electrode devices FP1, FP2; further field plates or field electrode devices may follow in the vertical direction in the trench structure 30.

An excerpt from a trench structure semiconductor device 10' such as is formed in a conventional manner is illustrated in sectional side view in FIG. 1D.

In this case, a first field electrode device FP1 and a second field electrode device FP2 are situated opposite one another in a vertically extending arrangement in the first extension direction Z in the trench structure 30. In this case, in particular an interface FPb of the second field electrode device FP2 and an interface FPa of the first field electrode device FP1 are situated directly opposite one another. Consequently, the first and second field electrode devices FP1 and FP2 are formed in a manner directly adjoining one another and opposite one another, so that between them and the mutually opposite interfaces FPa and FPb with a second insulation material 42 of the insulation region 40 provided in between, a spatial separation and an electrical insulation of the first and second field electrode devices FP1 and FP2 and thus overall a common interface region I1 are realized.

Conventionally, the interfaces FPa and FPb of the first and second field electrode devices FP1 and FP2 are formed in planar and smooth fashion and are arranged essentially parallel to one another.

What is disadvantageous about an arrangement of this type, however, is that only a weak electrical coupling of the first and second field electrode devices FP1 and FP2 can be achieved, under certain circumstances, despite an insulation and spatial separation formed even with a small layer thickness by means of the second insulation material 42 of the insulation region 40.

This is remedied according to the invention by virtue of the fact that, as is illustrated by way of example in FIGS. 1E to 1H, the common interface region I1 between the first and second field electrode devices FP1 and FP2 is formed in enlarged fashion in comparison with the situation in FIG. 1D and similar situations.

In the case of the arrangement in accordance with FIG. 1E, the first or lower field electrode device FP1 has a cutout 62 in its material 60. The cutout 62 in the material 60 for the first field electrode device FP1 is lined in its wall regions and bottom regions with the second insulation material 42 of the insulation region in such a way that the cutout 62 in the material 60 of the first field electrode device FP1 is not completely filled, with the result that a cavity remains. In accordance with the situation illustrated in FIG. 1E, the cavity is complementary and completely filled with the material 60 of the second field electrode device FP2, so that the material 60 of the second field electrode device FP2 that fills the cavity of the cutout 62 forms an elevation, protrusion, protuberance or a projection in the material 60 of the second field electrode device FP2. The cutout 62 and the elevation 64 in the first and in the second field electrode device FP1 and FP2, respectively, are thus brought into engagement with another or cooperate with one another. In this way, the interfaces FPa and FPb of the first and the second field electrode device FP1 and FP2, respectively, are no longer formed in planar fashion and parallel to one another, at least not in the global sense. Rather, they are folded into one another with a mutually conformal course. In this way, the interfaces FPa and FPb and thus also the common interface region I1 are formed in an enlarged manner in comparison with conventional conditions, as illustrated in FIG. 1D, so that a stronger capacitive electrical coupling of the first and second field electrode devices FP1 and FP2, respectively, results during operation.

In FIG. 1F, a plurality of intermeshing cutouts 62 and elevations 64 are formed in a cooperating manner in the materials 60 of the first and second field electrode devices FP1 and FP2, respectively, thus resulting in a comb-like or comb-shaped structure over the interfaces FPa and FPb—folded with one another in a conformal manner—of the first and second field electrode devices FP1 and FP2, respectively, and consequently in a common and thus also enlarged interface region J1 that is folded correspondingly in comb-like fashion or in comb-shaped fashion between the first field electrode device FP1 and the second field electrode device FP2.

In the case of the arrangement in FIG. 1G, the first or lower field electrode device FP1 has in its material 60 a cutout 62 which has a comparatively irregular structure and thereby provides an interface FPa enlarged to an even greater extent, which correspondingly according to the previous statements is again lined with the second insulation material 42 of the insulation region 40 conformally and in a manner not filling the cutout 62. A correspondingly complementary, engaging and cooperating protuberance or elevation 64 is formed by the material 60 of the second or upper field electrode device FP2 in such a way that the cavity structure of the cutout 62 that remains after conformal lining is completely filled and an irregularly folded and enlarged common interface region I1 is thus provided and formed between the first and second field electrode devices FP1 and FP2.

The embodiment of FIG. 1H illustrates a plurality of six field electrode devices FP1 to FP6 which are formed in a manner strung together vertically from bottom to top in the trench structure 30, each of the field plate electrodes FP1 to FP6 essentially having a Y shape or Y structure—viewed in cross section—and, between directly adjacent field electrode devices FPj, FPj+1, provision correspondingly being made of a layer of the second insulation material 42 of the insulation region 40 for spatial separation and for electrical insulation of the directly adjacent field electrode device FPj, FPj+1.

FIGS. 2A and 2B illustrate, in schematic and sectional side view, respectively a conventional trench structure semiconductor device 10' and an embodiment of the trench structure semiconductor device 10 according to the invention with corresponding potential profiles that occur in the off state of the trench structure semiconductor devices 10', 10. Only half a cell is illustrated in each case.

The arrangement in FIG. 2A has a plurality of four field electrode devices FP1 to FP4 which extend from bottom to top in a vertical arrangement in the trench structure 30 and are spatially separated and electrically insulated from one another by the second insulation material 42 and relative to the wall region and bottom region 30w, 30b of the trench structure 30 by the first insulation material 41 of the insulation region. The interfaces FPa and FPb of directly adjacent and mutually adjoining field electrode devices FPj, FPj+1 of the arrangement in FIG. 2A are formed in planar fashion and parallel to one another.

The arrangement in FIG. 2B illustrates an embodiment of the structure according to the invention for a trench structure semiconductor device 10. The field electrode devices FP1 to FP4 provided are formed in Y-shaped fashion or in Y-like fashion in cross section and thus have an enlarged common interface region I1 to I3.

In the case of the conventional trench structure semiconductor device 10' from FIG. 2A, a variation of the potential can be seen only in the upper half of the structure; the lower half is potential-free and cannot take up any voltage. In contrast thereto, the trench structure semiconductor device 10 according to the invention from FIG. 2B can take up voltage over the entire depth, so that a higher reverse voltage can be achieved by the trench structure semiconductor device 10 according to the invention in FIG. 2B.

FIG. 3 illustrates properties which can be achieved by corresponding parameters and geometry variations in the case of the concept according to the invention in the case of corresponding trench structure semiconductor devices 10 according to the invention.

FIGS. 4A to 4H illustrate, in sectional side view, excerpts from intermediate stages which are reached in a production method according to the invention for a trench structure semiconductor device 10 according to the invention, the illustrations in each case always showing only the respective left-hand half of a trench structure 30 or cell formed.

A semiconductor material region 20 is provided. In the customary manner, the hard mask—e.g., with or having nitride on oxide or between oxide layers—is applied to the surface 20a of the semiconductor material region and is patterned by means of a phototechnology—i.e. by application, selective exposure, development and selective removal of a photoresist—, so that the surface 20a of the semiconductor material region 20 is not covered by the hard mask at desired locations for trench structures. The trench structures are then formed in the semiconductor material region 20 by means of an etching process, thus resulting in the structure illustrated in FIG. 4A.

Figure 4B:
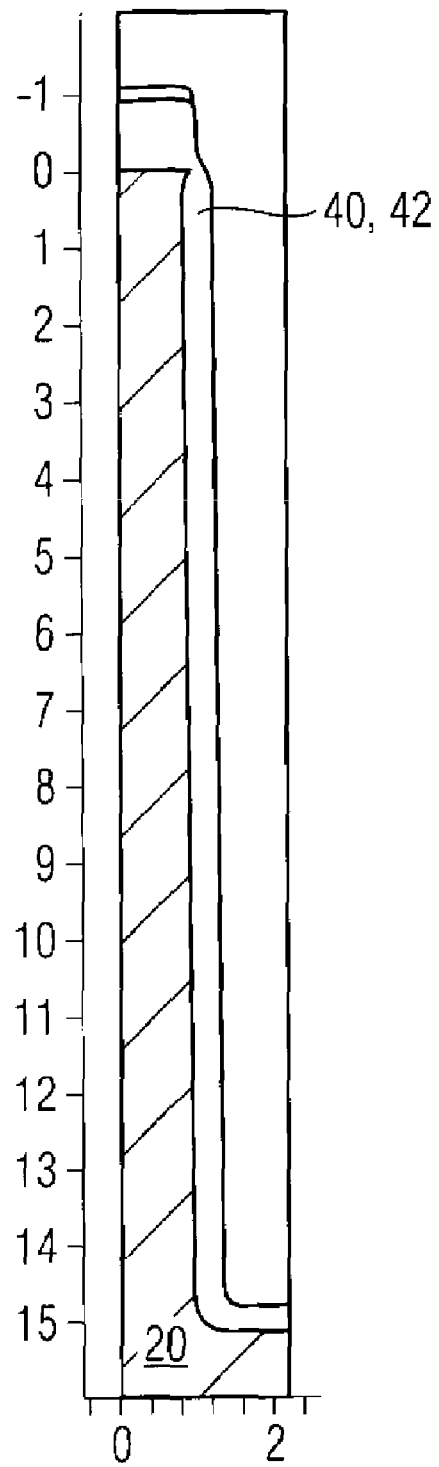

A field oxide is formed in conformally lining fashion in the trench structure by means of thermal oxidation and/or by means of deposition, thus resulting in the structure illustrated in FIG. 4B.

A nitride is then formed in conformally lining fashion in the trench structure. Nitride and oxide are removed at the bottom of the trench structure by means of anisotropic nitride etching and oxide etching, thus resulting in the structure illustrated in FIG. 4C. The bottom opening of the trench is important in this case.

Through skilful selection of the further method processes, a plurality of field plates or field electrodes are formed iteratively in the trench interior. In this case, the following method processes are run through repeatedly until the desired number of successive field electrodes or field plates has been formed.

The sequence comprises e.g.:
a step of deposition of polysilicon with a thickness which is less than half of the width of the remaining trench opening or trench width, reduced by the thickness of an oxide to be formed later, and to such an extent such that the remaining trench structure is filled in the bottom region and in the region of field plates deposited in preliminary processes, while in regions situated at a higher level only the trench sidewall and also the wafer surface are lined,
a process of filling the trench with an auxiliary layer, e.g., photoresist, which can be etched selectively with respect to poly and can serve as a poly etching mask,
a process of etching back the auxiliary layer in the trench structure as far as a defined height or depth,
a process of isotropic poly etching with the auxiliary layer as masking, with the result that the structure illustrated in FIG. 4D arises,
a process of removing the auxiliary layer and
a process of oxidizing the polysilicon, with the result that the structure illustrated in FIG. 4E arises.

By single or multiple repetition of these processes, the last oxidation being obviated, it is possible to produce a desired field electrode arrangement, with the result that the structure illustrated in FIG. 4F arises.

For completion there follow
a process of etching the nitride,
a process of etching the oxide, with the result that the structure illustrated in FIG. 4G arises,
a process of growing or applying a gate oxide, and
a process of depositing and etching back a gate polysilicon, with the result that the structure illustrated in FIG. 4H arises, and also
processes for introducing dopings, forming metallizations and the like.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A trench structure semiconductor device, comprising:
a semiconductor material region with a surface region;
at least one trench structure with a wall region and a bottom region, the at least one trench structure being provided in the interior of the semiconductor material region;
a plurality of field electrode devices formed in the interior of the trench structure as an electrode arrangement in a manner spaced apart and electrically insulated from one another and from the wall region of the trench structure by means of an insulation region; and
enlarged non-planar common interface regions with an insulation material between spatially directly adjacent and mutually adjoining field electrode devices, interfaces of the field electrode devices in the respective common interface regions being folded into one another with a mutually conformal course,
wherein the insulation material has an essentially homogenous thickness.

2. The trench structure semiconductor device as claimed in claim 1, in which the enlarged common interface region is formed by means of an increased roughness of at least one of the mutually opposite interfaces in the material of spatially directly adjacent and mutually adjoining field electrode devices in the interface region.

3. The trench structure semiconductor device as claimed in claim 2, in which the increased roughness is formed in the region of at least one of the field electrode devices, so that the insulation region has a homogeneous thickness, in particular.

4. The trench structure semiconductor device as claimed claim 1, in which the interface region is formed by means of one or a plurality of cutouts of at least one of the mutually opposite interfaces in the material of spatially directly adjacent and mutually adjoining field plate electrode devices in the interface region.

5. The trench structure semiconductor device as claimed in claim 1, in which the interface region is formed by means of one or a plurality of elevations of at least one of the mutually opposite interfaces in the material of spatially directly adjacent and mutually adjoining field plate electrode devices in the interface region.

6. The trench structure semiconductor device as claimed in claim 4, in which cutouts and/or elevations are in each case formed in the material of a field electrode device, so that the insulation has a homogeneous thickness, in particular.

7. The trench structure semiconductor device as claimed in claim 4, in which cutouts and/or elevations of one of the mutually opposite interfaces in the material of a first field electrode device in the interface region with a second, directly adjacent field electrode device adjoining the first are formed such that they cooperate or are in engagement in each case with corresponding elevations and/or cutouts of the directly adjacent and adjoining interface of the directly adjacent, adjoining and opposite interface in the material of the second field electrode device directly adjacent to and adjoining the first field electrode device in the interface region, so that the insulation has the essentially homogeneous thickness, in particular.

8. The trench structure semiconductor device as claimed in claim 4, in which—viewed in cross section—the mutually opposite interfaces of spatially directly adjacent and mutually adjoining field electrode devices are formed such that they cooperate or are intermeshed in comb-like fashion or in comb-shaped fashion.

9. The trench structure semiconductor device as claimed in claim 4, in which—viewed in cross section—the mutually opposite interfaces of spatially directly adjacent and mutually adjoining field electrode devices are formed such that they cooperate or are intermeshed in y-like fashion or in y-shaped fashion or in the form of a tuning fork.

10. The trench structure semiconductor device as claimed in claim 1, in which the trench structures are formed in a manner proceeding from the surface region of the semiconductor material region essentially in a first extension direction, which runs perpendicular to the surface region of the semiconductor material region, into the semiconductor material region.

11. The trench structure semiconductor device as claimed in claim 10, in which the field electrode devices of the electrode arrangement are formed as a stringing together of field electrode devices in the first extension direction in the interior of the trench structure.

12. The trench structure semiconductor device as claimed in claim 1, in which the trench structures are formed essentially in a second extension direction, which runs parallel to the surface region of the semiconductor material region, in the semiconductor material region.

13. The trench structure semiconductor device as claimed in claim 1, in which the field electrode device is formed in potential-free fashion or in floating fashion.

14. The trench structure semiconductor device as claimed in claim 1, in which a further electrode device, and in particular a control electrode device or a gate electrode device, is formed in the interior of the trench structure in a manner facing the surface region of the semiconductor material region and in a manner spatially separated and electrically insulated from the electrode arrangement of the plurality of field electrode devices by the insulation region and from the wall region of the trench structure, from the bottom region of the trench structure and/or from the semiconductor material region.

15. The trench structure semiconductor device as claimed in claim 14, in which the further electrode device is at a fixed electrical potential, in particular at source potential.

16. The trench structure semiconductor device as claimed in claim 1, which is formed as a device or as a combination of devices from the group consisting of a FET, a MOSFET, a trench transistor, a field plate transistor, a vertical transistor, a vertical trench transistor, an IGBT device, a p-channel transistor, a bipolar transistor, a diode device and a Schottky diode device.

17. The trench structure semiconductor device as claimed in claim 1, in which a pillar region doped oppositely to the doping of the surroundings is formed in the semiconductor material region and outside the trench structure and spatially at a distance from the latter, proceeding from the surface region of the semiconductor material region, the pillar region extending into the interior of the semiconductor material region.

18. The trench structure semiconductor device as claimed in claim 1, in which pairs of spatially directly adjacent field electrode devices which, in a common interface region, adjoin one another and are opposite one another are formed, relative to one another, in a targeted manner with differing degrees of pairwise electrical coupling or capacitance between the field electrode devices of the pairs of spatially directly adjacent field electrode devices which, in a common interface region, adjoin one another and are opposite one another, with respect to one another, in particular by means of a correspondingly targeted variation of the thickness of the insulation provided between the field electrode devices.

19. The trench structure semiconductor device as claimed in claim 1, in which the field electrode devices are formed such that they are electrically connected to one another via zener diodes or in high-impedance fashion in the trench structure or in an edge region.

20. A trench structure semiconductor device, comprising:
a semiconductor material region with a surface region;
means for providing at least one trench structure with a wall region and a bottom region, the at least one trench structure being provided in the interior of the semiconductor material region;
means for providing a plurality of field electrode devices formed in the interior of the trench structure means as an electrode arrangement in a manner spaced apart and electrically insulated from one another and from the wall region of the trench structure by an insulation region; and
enlarged non-planar common interface regions with an insulation material between spatially directly adjacent and mutually adjoining field electrode devices, interfaces of the field electrode devices in the respective common interface regions being folded into one another with a mutually conformal course,
wherein the insulation material has an essentially homogeneous thickness.

* * * * *